(12) United States Patent
Yan

(10) Patent No.: US 8,144,026 B2
(45) Date of Patent: Mar. 27, 2012

(54) ELECTROSTATIC DISCHARGE PROTECTION DEVICE WITH PHOSPHORS AND METHOD OF FABRICATING THE SAME

(75) Inventor: Shuo-Ting Yan, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 828 days.

(21) Appl. No.: 12/080,032

(22) Filed: Mar. 31, 2008

(65) Prior Publication Data

US 2008/0238702 A1  Oct. 2, 2008

(30) Foreign Application Priority Data

Mar. 30, 2007  (CN) .......................... 2007 1 0073760

(51) Int. Cl.
G08B 21/00  (2006.01)

(52) U.S. Cl. .......................................... 340/653; 257/79

(58) Field of Classification Search .................. 340/653; 257/79–81, 99, 100

See application file for complete search history.

(56) References Cited

U.S. PATENT DOCUMENTS

| | | | |
|---|---|---|---|
| 5,673,028 A * | 9/1997 | Levy | 340/635 |
| 7,279,726 B2 | 10/2007 | Esmark et al. | |
| 7,365,371 B2 * | 4/2008 | Andrews | 257/99 |
| 7,621,655 B2 * | 11/2009 | Roberts et al. | 362/249.02 |
| 2005/0230560 A1 | 10/2005 | Glatkowski et al. | |
| 2005/0239227 A1 * | 10/2005 | Aanegola et al. | 438/26 |
| 2010/0103660 A1 * | 4/2010 | van de Ven et al. | 362/231 |

* cited by examiner

Primary Examiner — George Bugg
Assistant Examiner — Edny Labbees
(74) Attorney, Agent, or Firm — Altis Law Group, Inc.

(57) ABSTRACT

An exemplary electrostatic discharge protection device includes: an electrostatic discharge part configured for discharging electrostatic when the electrostatic is larger than a threshold value; and a light emitting part configured for emitting light when electrostatic discharge happens.

19 Claims, 2 Drawing Sheets

ELECTROSTATIC DISCHARGE PROTECTION DEVICE WITH PHOSPHORS AND METHOD OF FABRICATING THE SAME

FIELD OF THE INVENTION

The present invention relates to electrostatic discharge (ESD) protection devices, and more particularly to an ESD protection device with phosphors and a method of fabricating the ESD protection device.

GENERAL BACKGROUND

Static electricity is likely to be generated in the processes of manufacturing, assembling, testing, storing, or transporting electronic components. Moreover, static electricity can also accumulate in the human body, testing instruments, storing devices, and even in the electronic components themselves. When a human body, a testing instrument, or a storing device contacts an electronic component, ESD is liable to occur. When this happens, it can seriously damage or even destroy the electronic component. Therefore, an ESD protection device needs to be installed in various electronic components.

FIG. 3 is an abbreviated circuit diagram of a conventional liquid crystal display (LCD). The LCD 1 includes a plurality of ESD protection devices 10, a first common electrode 141, a second common electrode 142, a third common electrode 143, a plurality of scan lines 12 parallel to each other, a plurality of data lines 13 parallel to each other. The scan lines 12 are perpendicular to the data lines 13. Each scan line 12 is connected to the first common electrode 141 via an ESD protection device 10, and is also connected to the second common electrode 142 via another ESD protection device 10. Each data line 13 is connected to the third common electrode 143 via an ESD protection device 10.

FIG. 4 is a circuit diagram of one of the ESD protection devices 10. The ESD protection device 10 is connected between a first conductor line 101 and a second conductor line 102. The first conductor line 101 may be one of the scan lines 12 when the second conductor line 102 is one of the first common electrode 141 and the second common electrode 142. Alternatively, the first conductor line 101 may be one of the data lines 13 when the second conductor line 102 is the third common electrode 143. The ESD protection device 10 includes a first transistor 110, a second transistor 120, and a third transistor 130. A gate electrode of the first transistor 110 is connected to the first conductor line 101, and a drain electrode of the first transistor 110 is connected to the first conductor line 101. Further, a source electrode of the first transistor 110 is connected to a gate electrode of the third transistor 130. A gate electrode of the second transistor 120 is connected to the second conductor line 102, and a drain electrode of the second transistor 120 is connected to the second conductor line 102. Further, a source electrode of the second transistor 120 is connected to the gate electrode of the third transistor 130. A drain electrode of the third transistor 130 is connected to the second conductor line 102, and a source electrode of the third transistor 130 is connected to the first conductor line 101.

When a voltage difference between the first conductor line 101 and the second conductor line 102 is larger than a setting voltage of the first transistor 110 or the second transistor 120, the third transistor 130 is turned on. Accordingly, ESD occurs via the activated third transistor 130.

However, when the ESD protection device 10 discharges, users generally cannot perceive the occurrence of the discharge and cannot ascertain the time of discharge. The reason is that the ESD protection device 10 has no means for alerting or recording the occurrence of ESD.

What is needed, therefore, is an ESD protection device and a method of fabricating the ESD protection device which can overcome the above-described deficiencies.

SUMMARY

An electrostatic discharge protection device includes: an electrostatic discharge part configured for discharging electrostatic energy when the electrostatic energy is larger than a threshold value of the electrostatic discharge part; and a light emitting part configured for receiving the discharged electrostatic energy and converting the received energy into light emission.

A liquid crystal display includes an electrostatic discharge protection system. The electrostatic discharge protection system includes an electrostatic discharge part configured for discharging electrostatic energy when the electrostatic energy is larger than a threshold value of the electrostatic discharge part; and a light emitting part configured for receiving the discharged electrostatic energy and converting the received energy into light emission.

A method of fabricating an electrostatic discharge protection device includes: providing an electrostatic discharge part; providing a light emitting part capable of converting electrical energy into light energy; and attaching the light emitting part to the electrostatic discharge part.

Other novel features and advantages will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments of the present invention in detail.

Figure 1:
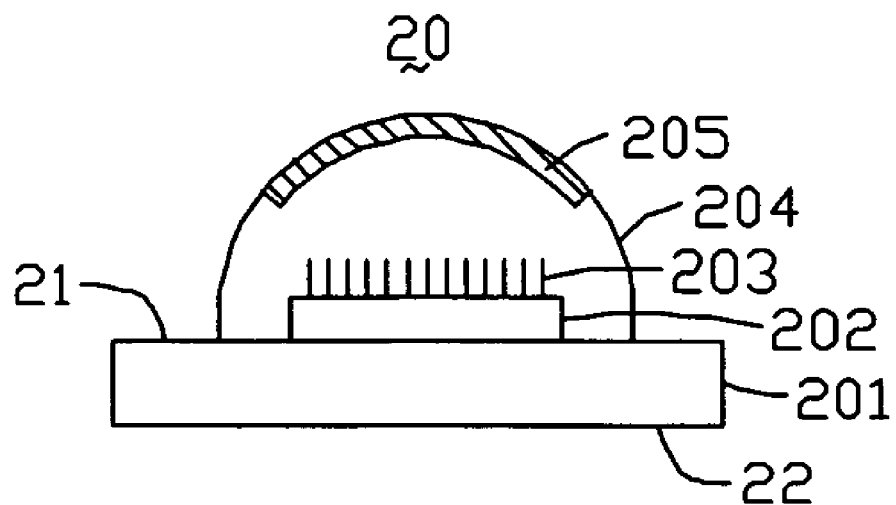
FIG. 1 is a schematic, side cross-sectional view of an ESD protection device according to a first embodiment of the present invention.

FIG. 1 is a schematic, side cross-sectional view of an ESD protection device 20 according to a first embodiment of the present invention. The ESD protection device 20 includes a silicon substrate 201, an iron film 202, a plurality of carbon nano-tubes 203, and a transparent cover 204. The silicon substrate 201 includes a first surface 21 and a second surface 22 at opposite sides thereof. The iron film 202 is formed on the first surface 21 of the silicon substrate 201, and the plurality of carbon nano-tubes 203 is formed on the iron film 202. An area of the iron film 202 is smaller than that of the first surface 21 of the silicon substrate 201. The silicon substrate 201 is sealed with the transparent cover 204. The transparent cover 204 and the silicon substrate 201 cooperatively form an accommodating space having the iron film 202 and the plurality of carbon nano-tubes 203 therein. An inner surface of the transparent cover 204 is spherical, and a portion of the inner surface of the transparent cover 204 above the iron film 202 is coated with phosphors 205.

Multiple ESD protection devices 20 can be used in LCDs, and also in the processes of manufacturing LCDs. The ESD protection devices 20 can be mounted on items such as machine arms, device shells, and circuit boards via surface mount technology.

Static electricity generally accumulates on machine arms, device shells, and the circuit boards. When the static electricity accumulates to a certain extent, an instantaneous high voltage is correspondingly generated. The high voltage is transmitted to the iron film 202 of the ESD protection device 20 via the silicon substrate 201, and electron beams are emitted from free ends of the carbon nano-tubes 203 when the high voltage is larger than a threshold voltage of the ESD protection device 20. The phosphors 205 are bombarded by the electron beams and correspondingly emit visible light. That is, the energy of the electron beams is converted into light energy by the phosphors 205, and thereby the energy of the electrostatic discharge is released.

The moment when the phosphors 205 emit visible light is a discharging time of the ESD protection device 20. The discharging time of one or more of the ESD protection devices 20 can be monitored and recorded by a computer (not shown) equipped with appropriate software. The cause of the ESD can be backtracked according to the discharging time or times, and suitable remedial and/or preventive measures can be correspondingly taken to protect the corresponding LCDs and/or manufacturing equipment such as machine arms.

Figure 2:
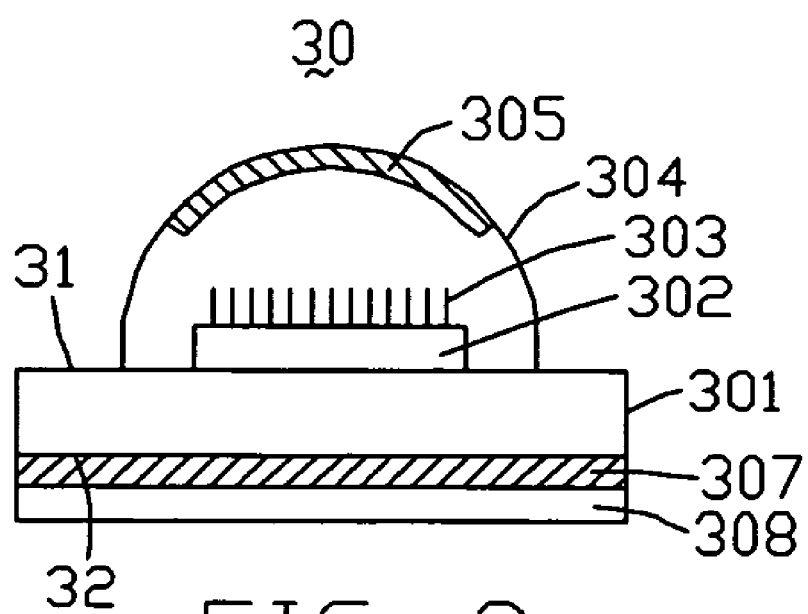
FIG. 2 is a schematic, side cross-sectional view of an ESD protection device according to a second embodiment of the present invention.
Figure 3:
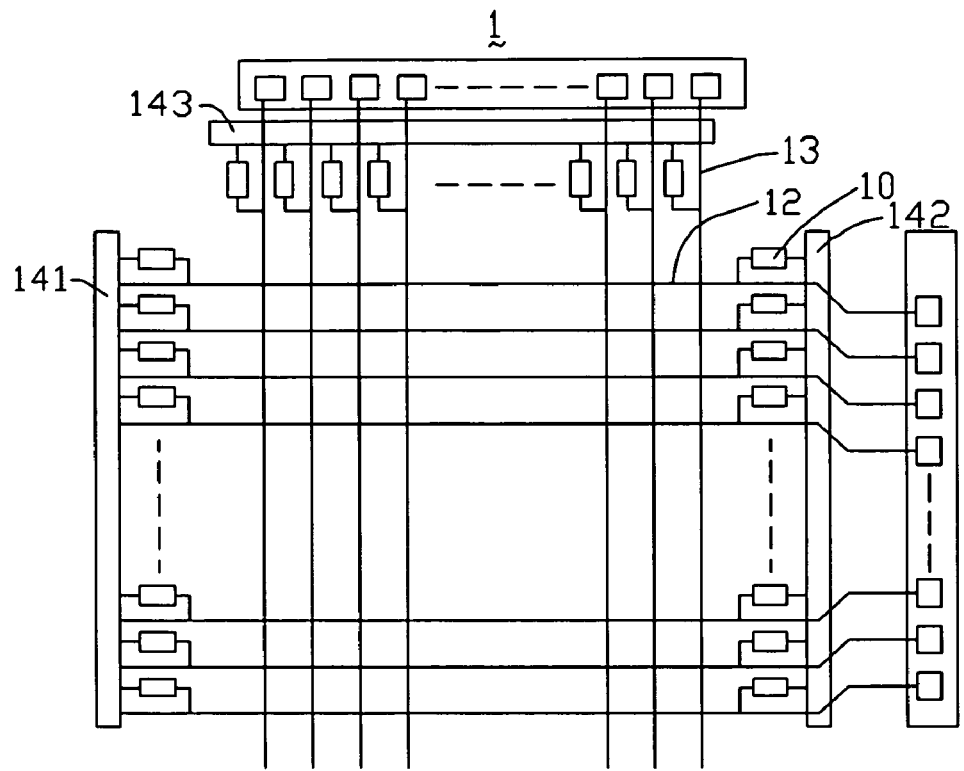
FIG. 3 is an abbreviated circuit diagram of a conventional LCD, the LCD including a plurality of ESD protection devices.
Figure 4:
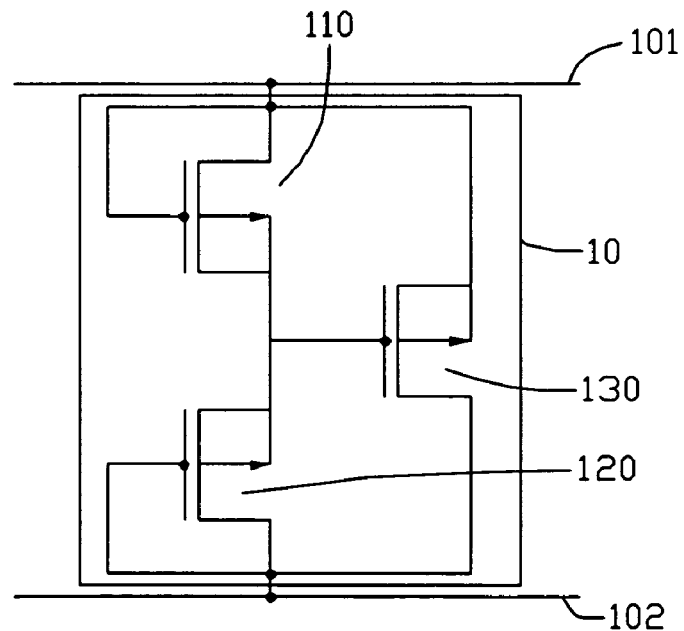
FIG. 4 is a circuit diagram of one of the ESD protection devices of FIG. 3.

FIG. 2 is a schematic diagram of an ESD protection device 30 according to a second embodiment of the present invention. The ESD protection device 30 is similar to the ESD protection device 20. However, a unique characteristic of the ESD protection device 30 is that the ESD protection device 30 further includes a donor doping layer 307 and an aluminum film 308. The donor doping layer 307 is formed on a second surface 32 of a silicon substrate 301, and the aluminum film 308 is formed on a bottom of the donor doping layer 307. An area of the donor doping layer 307 is the same as that of the aluminum film 308. The donor doping layer 307 and the aluminum film 308 can reduce a resistance of the silicon substrate 301. Thus, a threshold voltage of the ESD protection device 30 is lower than that of the ESD protection device 20.

An exemplary method of fabricating the ESD protection device 20 includes the following steps: step 1, providing a silicon substrate 201, the silicon substrate 201 including a first surface 21 and a second surface 22 at opposite sides thereof; step 2, forming an iron film 202 on the first surface 21 of the silicon substrate 201 via a physical vapor deposition method; step 3, etching the iron film 202 according to a pre-designed circuit pattern; step 4, forming a plurality of carbon nano-tubes 203 on the iron film 202; step 5, cutting the silicon substrate 201; step 6, providing a transparent cover 204; step 7, coating phosphors 205 on an inner surface of the transparent cover 204; and step 8, sealing the transparent cover 204 with the silicon substrate 201.

In step 4, firstly, methane gas ($CH_4$), hydrogen gas ($H_2$), and nitrogen gas ($N_2$) are provided above the iron film 202. Then a chemical reaction occurs, and according to the following equation: $CH_4+H_2=C+3H_2$. In the chemical reaction, one of the products is carbon atoms, which accumulate on the iron film 202 and finally form a plurality of carbon nano-tubes 203. Furthermore, in the chemical reaction, the nitrogen gas is used to accelerate the rate of reaction rate and facilitate good orientation of the carbon nano-tubes 203.

In step 6, the transparent cover 204 can be manufactured with a plastic extrusion method, or a glass heating and stamping method. An inner surface of the transparent cover 204 is spherical.

A method of fabricating the ESD protection device 30 includes the following steps: step 1, providing a silicon substrate 301, the silicon substrate 301 including a first surface 31 and a second surface 32 at opposite sides thereof; step 2, forming an iron film 302 on the first surface 31 of the silicon substrate 301 via a physical vapor deposition method; step 3, heavily depositing donor elements such as phosphorus and arsenic in the second surface 32 of the silicon substrate 301 to form a donor doping layer 307; step 4, forming an aluminum film 308 on the donor doping layer 307 via a physical vapor deposition method, the aluminum film 308 being in ohmic contact with the silicon substrate 301; step 5, etching the iron film 302 according to a pre-designed circuit pattern; step 6, forming a plurality of carbon nano-tubes 303 on the iron film 302; step 7, cutting the silicon substrate 301; step 8, providing a transparent cover 304; step 9, coating phosphors 305 on an inner surface of the transparent cover 304; and step 10, sealing the transparent cover 304 with the silicon substrate 301.

It is to be further understood that even though numerous characteristics and advantages of the present embodiments have been set out in the foregoing description, together with details of the structures and functions of the embodiments, the disclosure is illustrative only; and that changes may be made in detail, especially in matters of shape, size, and arrangement of parts within the principles of the invention to the full extent indicated by the broad general meaning of the terms in which the appended claims are expressed.

What is claimed is:

1. An electrostatic discharge protection device, comprising:
    an electrostatic discharge part configured for discharging electrostatic energy, the electrostatic discharge part comprising a free end that emits electron beams when a voltage generated by the electrostatic energy and applied to the electrostatic discharge part is larger than a threshold value of the electrostatic discharge part; and
    a light emitting part configured for receiving the discharged electrostatic energy, wherein when the light emitting part is bombarded by the electron beams, the light emitting part emits light by converting energy of the electron beams into light energy.

2. The electrostatic discharge protection device as claimed in claim 1, wherein the light emitting part comprises phosphors.

3. The electrostatic discharge protection device as claimed in claim 2, wherein the electrostatic discharge part comprises an iron film and a plurality of carbon nano-tubes formed on the iron film, the plurality of carbon nano-tubes emitting the electron beams when the voltage generated by the electrostatic energy and applied to the electrostatic discharge part is larger than the threshold value.

4. The electrostatic discharge protection device as claimed in claim 3, further comprising a silicon substrate and a transparent cover, wherein the iron film is formed on a surface of the silicon substrate, the phosphors are coated on an inner surface of the transparent cover, the transparent cover is sealed with the silicon substrate, and the transparent cover and the silicon substrate cooperatively form an accommodating space having the iron film and the plurality of carbon nano-tubes therein.

5. The electrostatic discharge protection device as claimed in claim 4, wherein the inner surface of the transparent cover is spherical.

6. The electrostatic discharge protection device as claimed in claim 4, wherein an area of the iron film is smaller than that of the surface of the silicon substrate.

7. The electrostatic discharge protection device as claimed in claim 3, further comprising: a silicon substrate, which comprises a first surface and a second surface at opposite sides thereof; a donor doping layer formed on the second surface of the silicon substrate; an aluminum film formed on the donor doping layer; and a transparent cover; wherein the iron film is formed on the first surface of the silicon substrate, the phosphors are coated on an inner surface of the transparent cover, the transparent cover is sealed with the silicon substrate, and the transparent cover and the silicon substrate cooperatively form an accommodating space having the iron film and the plurality of carbon nano-tubes therein.

8. The electrostatic discharge protection device as claimed in claim 7, wherein the inner surface of the transparent cover is spherical.

9. The electrostatic discharge protection device as claimed in claim 7, wherein an area of the iron film is smaller than that of the first surface of the silicon substrate.

10. The electrostatic discharge protection device as claimed in claim 7, wherein an area of the donor doping layer is the same as that of the aluminum film.

11. A liquid crystal display, comprising an electrostatic discharge protection system, wherein the electrostatic discharge protection system comprises:
   an electrostatic discharge part configured for discharging electrostatic energy, the electrostatic discharge part comprising a free end that emits electron beams when a voltage generated by the electrostatic energy and applied to the electrostatic discharge part is larger than a threshold value of the electrostatic discharge part; and
   a light emitting part configured for receiving the discharged electrostatic energy, wherein when the light emitting part is bombarded by the electron beams, the light emitting part emits light by converting energy of the electron beams into light energy.

12. A method of fabricating an electrostatic discharge protection device, the method comprising:
   providing an electrostatic discharge part, the electrostatic discharge part comprising a free end that emits electron beams when a voltage generated by the electrostatic energy and applied to the electrostatic discharge part is larger than a threshold value of the electrostatic discharge part;
   providing a light emitting part, wherein when the light emitting part is bombarded by the electron beams, the light emitting part emits light by converting energy of the electron beams into light energy; and
   attaching the light emitting part to the electrostatic discharge part.

13. The method as claimed in claim 12, wherein providing the light emitting part comprises:
   providing a transparent cover; and
   coating phosphors on an inner surface of the transparent cover.

14. The method as claimed in claim 13, wherein providing the electrostatic discharge part comprises:
   providing a silicon substrate;
   forming an iron film on a surface of the silicon substrate;
   etching the iron film;
   forming a plurality of carbon nano-tubes on the iron film; and
   cutting the silicon substrate; and
   attaching the light emitting part to the electrostatic discharge part comprises:
   sealing the transparent cover with the silicon substrate.

15. The method as claimed in claim 14, wherein the transparent cover is manufactured by a plastic extrusion method.

16. The method as claimed in claim 14, wherein the transparent cover is manufactured by a glass heating and stamping method.

17. The method as claimed in claim 13, wherein the inner surface of the transparent cover is spherical.

18. The method as claimed in claim 13, wherein providing the electrostatic discharge part comprises:
   providing a silicon substrate, the silicon substrate comprising a first surface and a second surface at opposite sides thereof;
   forming an iron film on the first surface of the silicon substrate;
   forming a donor doping layer on the second surface of the silicon substrate;
   forming an aluminum film on the donor doping layer;
   etching the iron film;
   forming a plurality of carbon nano-tubes on the iron film; and
   cutting the silicon substrate; and
   attaching the light emitting part to the electrostatic discharge part comprises:
   sealing the transparent cover with the silicon substrate.

19. The method as claimed in claim 18, wherein an area of the donor doping layer is the same as that of the aluminum film.

* * * * *